United States Patent [19]
Yeung

[11] Patent Number: 6,100,691
[45] Date of Patent: Aug. 8, 2000

[54] BIRDCAGE RESONATOR FOR MRI SYSTEM

[75] Inventor: David Ka Wai Yeung, Tai Po, The Hong Kong Special Administrative Region of the People's Republic of China

[73] Assignee: BTG International Limited, London, United Kingdom

[21] Appl. No.: 08/980,793

[22] Filed: Dec. 1, 1997

Related U.S. Application Data

[63] Continuation of application No. PCT/GB96/01316, Jun. 3, 1996, abandoned.

[30] Foreign Application Priority Data

Jun. 1, 1995 [GB] United Kingdom .................... 9511101

[51] Int. Cl.$^7$ ...................................................... G01V 3/00
[52] U.S. Cl. ............................................ 324/318; 324/322
[58] Field of Search ............................. 324/318, 320–322

[56] References Cited

U.S. PATENT DOCUMENTS

| | | | |
|---|---|---|---|
| 4,443,760 | 4/1984 | Edelstein et al. ........................ | 324/309 |
| 4,837,515 | 6/1989 | Nishihara et al. ....................... | 324/318 |
| 5,194,811 | 3/1993 | Murphy-Boesch et al. ............. | 324/322 |
| 5,202,635 | 4/1993 | Srinivasan et al. ..................... | 324/322 |
| 5,212,450 | 5/1993 | Murphy-Boesch et al. ............. | 324/322 |
| 5,309,104 | 5/1994 | Frederick ................................. | 324/318 |
| 5,367,261 | 11/1994 | Frederick ................................ | 324/318 |
| 5,372,137 | 12/1994 | Wong et al. ............................. | 324/318 |
| 5,986,454 | 11/1999 | Leifer ...................................... | 324/318 |
| 6,029,082 | 2/2000 | Srinivasan et al. ..................... | 600/422 |

FOREIGN PATENT DOCUMENTS

| | | |
|---|---|---|
| 0 133 365 | 2/1985 | European Pat. Off. . |
| 33 47 597 | 7/1985 | Germany . |

OTHER PUBLICATIONS

Merriam Webster's tenth edition Dictionary p. 962 1997 no month.

Journal of Magnetic Resonance, vol. 94, No. 3, Oct. 1, 1991, Duluth, MN, US, pp. 550–550–556, XP000235341 M.D. Harpen: "The Spherical Birdcage Resonator" see the whole document.

*Primary Examiner*—Christine K. Oda
*Assistant Examiner*—Tiffany A. Fetzner
*Attorney, Agent, or Firm*—Nixon & Vanderhye

[57] ABSTRACT

Bird case resonator coil suitable for use in an MRI system, having a pair of parallel conducting end rings and connected between the end rings a number N of conductors spaced around the end rings at intervals of $2\pi 1/N$. The conductors curve along elliptical paths outside of and beyond the plane of the end of the rings, and are located between the end rings.

12 Claims, 3 Drawing Sheets

BIRDCAGE RESONATOR FOR MRI SYSTEM

This is a continuation of PCT/GB96/01316, filed 3 Jun. 1996, now abandoned.

This invention relates to a magnetic coil for transmitting or receiving a magnetic field, for example the radio-frequency magnetic field in a magnetic resonance system, and relates especially to magnetic coils known as birdcage resonators.

BACKGROUND OF THE INVENTION

The term magnetic resonance systems means magnetic resonance imaging (MRI) and magnetic resonance spectroscopy (MRS) which in this specification will be referred to as MR systems. In such systems, a material under investigation is exposed to a static magnetic field and a radio-frequency magnetic field to generate magnetic resonance in the material, and a property of the magnetic resonance is detected which is dependent on the structure of the material and of the environment of nuclei within that material.

In a paper by C. E. Hayes et al., in the Journal of Magnetic Resonance, Volume 63, 1985, pages 622–628, an r.f. coil known as a birdcage resonator is described, comprising two circular conducting end rings connected by straight parallel conductors, known as "legs". The birdcage resonator is suitable for use in MR systems in which the static magnetic field is parallel to the magnetic bore, i.e. horizontal. The r.f. field produced by a birdcage resonator is highly homogeneous, an essential factor in MR systems, and the resonator can be used in quadrature to improve the sensitivity of the MR system, and it can also be dual-tuned to perform simultaneous measurements on two types of nuclei within the material under test.

However for horizontal magnet bore MR systems with a vertical static magnetic field, the birdcage cannot be used in quadrature. In addition, if the birdcage in the design as described by Hayes is used in an MR system with a horizontal bore, access to the sample/patient is severely limited by the legs on the resonator.

Solenoidal coils are commonly used for vertical field MR systems as whole-body and head coils. However, unlike birdcage resonators, they cannot be driven in quadrature. Further, their cylindrical structure is inherently claustrophobic, a major disadvantage for whole body MR systems. Both the solenoidal and the birdcage coil have one common disadvantage: they offer very limited side access to the patient/sample.

An alternative coil, known as a cross-ellipse coil, is described in UK Patent No. 2144918, National Research Development Corporation, which has an advantageously open structure, thus minimising claustrophobic effects, but such a coil is inherently less sensitive and less efficient than a birdcage resonator.

In DE 3347597, Philips, FIG. 15 discloses a resonator having a barrel-shape, but the precise shape of the curve is not specified, and the resonator is not a birdcage resonator.

SUMMARY OF THE INVENTION

According to the invention a magnetic coil comprises a pair of parallel conducting end rings, and connected between the end rings a number N of conductors spaced around the end rings at intervals of $$\frac{2\pi}{N},$$

the conductors curving outwards between the end rings along elliptical paths.

In one arrangement the planes in which the elliptical paths lie are radial to the end rings. Optionally there are four conductors spaced at 90° intervals around the end rings.

In an alternative arrangement the conductors are associated in pairs, each pair of conductors curving outwards from the rings along parallel elliptical paths, the planes in which the elliptical paths lie being parallel to the radius to each end ring intermediate between the connection points of that pair of conductors to the ring. Optionally there are eight conductors spaced at 45° intervals around the end rings and arranged as four pairs.

Preferably there is further provided a number N of capacitors in each end ring, connected between adjacent conductors whereby a high-pass birdcage resonator is provided.

Alternatively there is further provided a number N of capacitors connected one in each conductor of the magnetic coil, whereby a low-pass birdcage-type resonator is provided.

In a third option, there are N capacitors in each end ring, connected between adjacent conductors, and there are a further N capacitors connected one in each conductor, whereby a bandstop birdcage-type resonator is provided.

An MR system may comprise a magnet having a horizontal bore and providing a static magnetic field, and a magnetic coil according to the invention arranged with its end rings in horizontal planes within the horizontal bore. The magnetic coil may be arranged either to generate or to detect a magnetic field at radio frequencies. The static magnetic field may be either horizontal or vertical.

It is an advantage of such an MR system that access to the sample/patient within the bore is good as the coil according to the invention has essentially an open structure.

BRIEF DESCRIPTION OF THE DRAWINGS

The prior art will now be described by reference to FIG. 1 which shows a birdcage resonator designed by Hayes et al. as referred to above, and the invention will be described by way of example only with reference to the following Figures in which.

DETAILED DESCRIPTION OF PREFERRED EMBODIMENT

Figure 1:
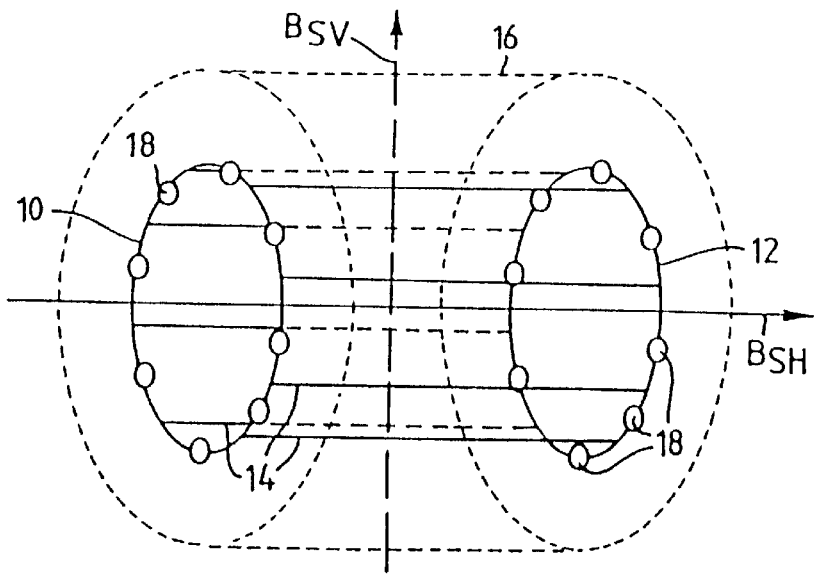

In FIG. 1, Hayes's birdcage resonator comprises two circular conducting end rings 10,12 connected by eight straight parallel conducting "legs" 14 spaced equally around each end ring. The resonator is positioned with its legs horizontal and within the horizontal circular bore 16 of a magnet in an MR system; the magnet provides either a horizontal static magnetic field $B_{SH}$ along the axis of the bore 16, or alternatively a vertical static magnetic field $B_{SV}$ shown by the chain line.

Optionally there may be provided sixteen capacitors 18, eight in each end ring, each capacitor positioned between the connection points of a pair of adjacent legs; such a resonator constitutes a high-pass filter. Alternatively, there may be a capacitor in each leg (not illustrated) when the resonator forms a low-pass filter; in a third option the high-pass and low-pass arrangements are combined to give a bandstop filter.

Figure 2A:
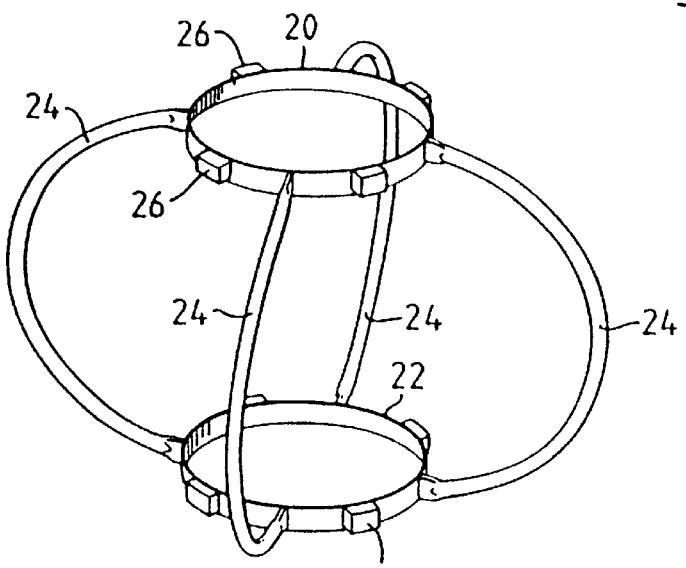
FIGS. 2a and 2b illustrate schematically a view and an end view of a four-leg coil according to the invention.
Figure 2B:
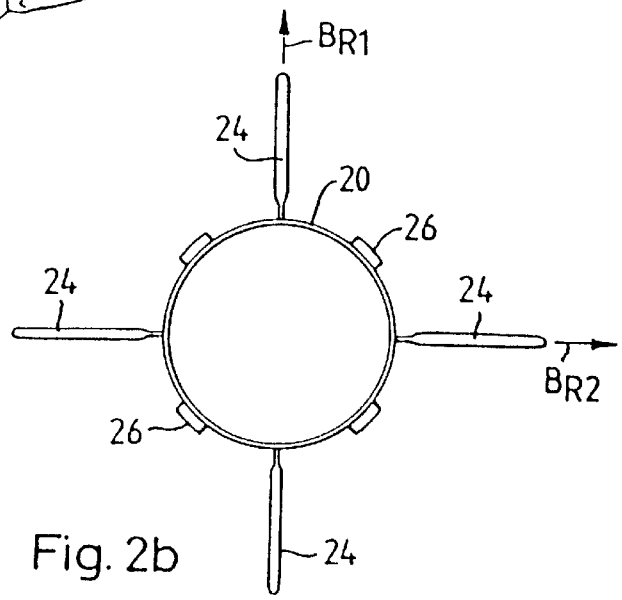

In FIG. 2a, a resonator coil according to the invention comprises two circular conducting end rings 20,22 connected at equispaced positions by four conducting legs 24; the four legs curve outwards from each end ring along elliptical paths. The end view of FIG. 2b shows that all the elliptical planes in which the paths lie are radial to the end rings at the points of connection with the legs 24.

In this arrangement the radio-frequency magnetic fields $B_{R1}$ and $B^R2$ generated by the coil will be radially outwards along any adjacent two of the radii to the connection points of the legs; since the coil has a four-fold symmetry, it can be operated in quadrature.

There may also be provided eight capacitors 26, four in each end ring 20,22 as shown schematically. Such capacitors allow tuning of the high-pass coil. To maintain four-fold symmetry, all capacitors within each ring must be identical and the ring segments must be equal.

In FIG. 3 an alternative coil according to the invention comprises two parallel spaced conducting end rings 30,32 connected by eight conducting legs 34 which curve outwards between the end rings along elliptical paths.

The legs are arranged in four pairs, 34A, B, C, D; the legs in each pair curve outwards along parallel elliptical paths, the planes in which the paths lie being parallel to the radius to the ring at the point midway between the connection points of each pair of legs. The directions of the r.f. magnetic fields $B_{R3}$, $B_R4$ may lie along any radius to the ring at a point midway between the connection points of the legs in a pair, see FIG. 3b.

It is an advantage of the eight-leg version illustrated in FIG. 3 that it has increased sensitivity in comparison with the four-leg version of FIG. 2.

The eight-leg version may also be provided with eight capacitors 26 in each end ring, spaced between the connection points of the eight legs to form a high-pass filter. Alternatively, (not illustrated) there may be a capacitor in each leg 34, to provide a low-pass filter. In a third option (not illustrated) the high-pass and low-pass arrangements may be combined to form a bandstop filter.

Figure 3A:
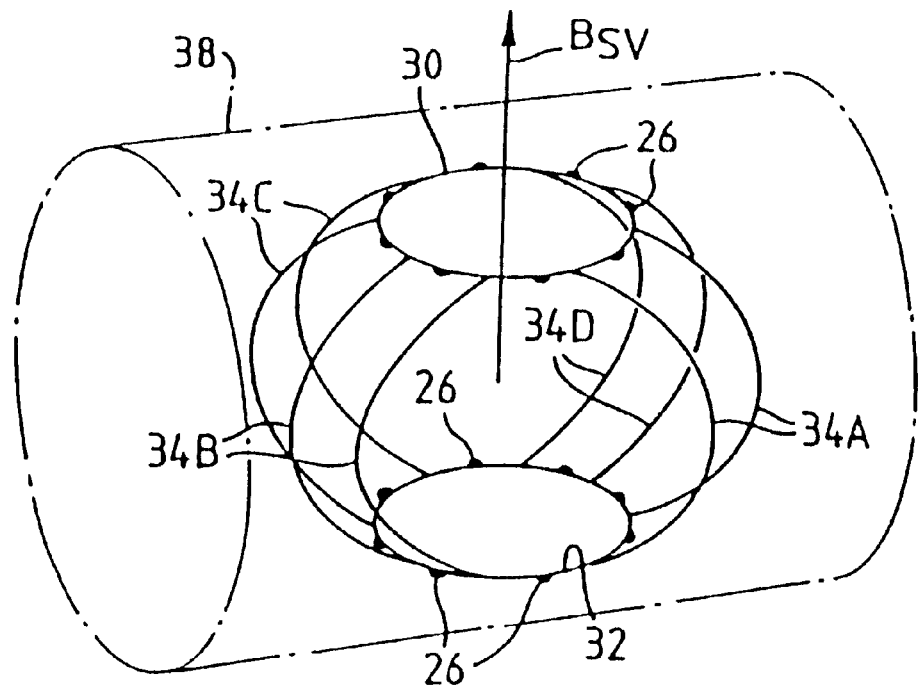
FIGS. 3a and 3b illustrate schematically a view and an end view of an eight-leg coil according to the invention.

It will be appreciated from FIG. 3a that the conducting loops formed by adjacent legs and the end rings between those legs are not equal. The loops formed by the legs within each pair are smaller than the loops formed by one leg from each adjacent pair of legs; their effective inductances are therefore different and, in order to obtain the fundamental mode birdcage resonance, appropriate capacitor values are required for each of the two loop sizes; these values can be calculated using well known principles.

The eight-leg version of a birdcage resonator as illustrated in FIG. 3 may be operated in quadrature if desired as four-fold symmetry is maintained by using appropriate capacitor values in the end rings. The direction of the field generated is preferentially along opposing larger loops, but can be changed to generation along opposing smaller loops if desired.

Figure 3B:
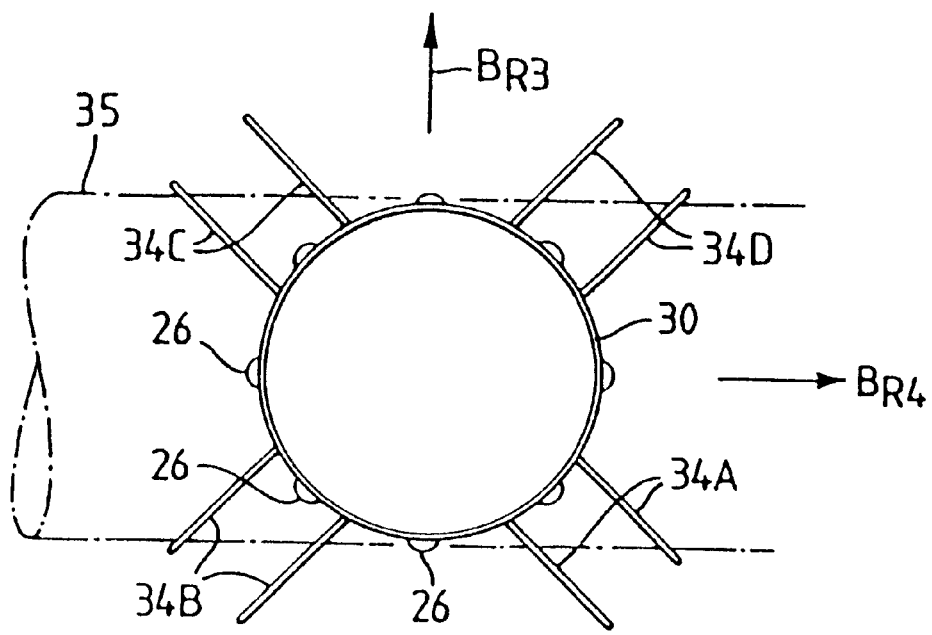

It can be seen from FIG. 3 that access for a patient or a sample is through the substantial aperture between each pair of curved legs, for example between pair 34B and 34C, or through the end rings, making it attractive for interventional MR systems. The eight-leg coil has a notably open structure, making it attractive for use as a head coil in vertical field open MR systems. FIG. 3b illustrates an imaginary tubular access volume 35 and its position with respect to the legs, showing the considerable diameter of the tube.

FIG. 3a illustrates the position of the coil within the horizontal bore 38 of a magnet providing a static, vertical magnetic field $B_{SV}$. The directions of the quadrature r.f. magnetic fields $B_{R3}$, $B_R4$ [see FIG. 3b] will lie in the horizontal plane, either along the axis or at right angles to the axis of the bore 38.

In addition to the arrangement illustrated in FIGS. 2a and 3a, a birdcage according to the invention can be used for horizontal field MR applications. However, the birdcage resonator can then operate only in the linear mode as opposed to the quadrature mode. If the purpose of the MR scan is to allow intervention on the patient, then the open access structure can be advantageous.

Figure 4:
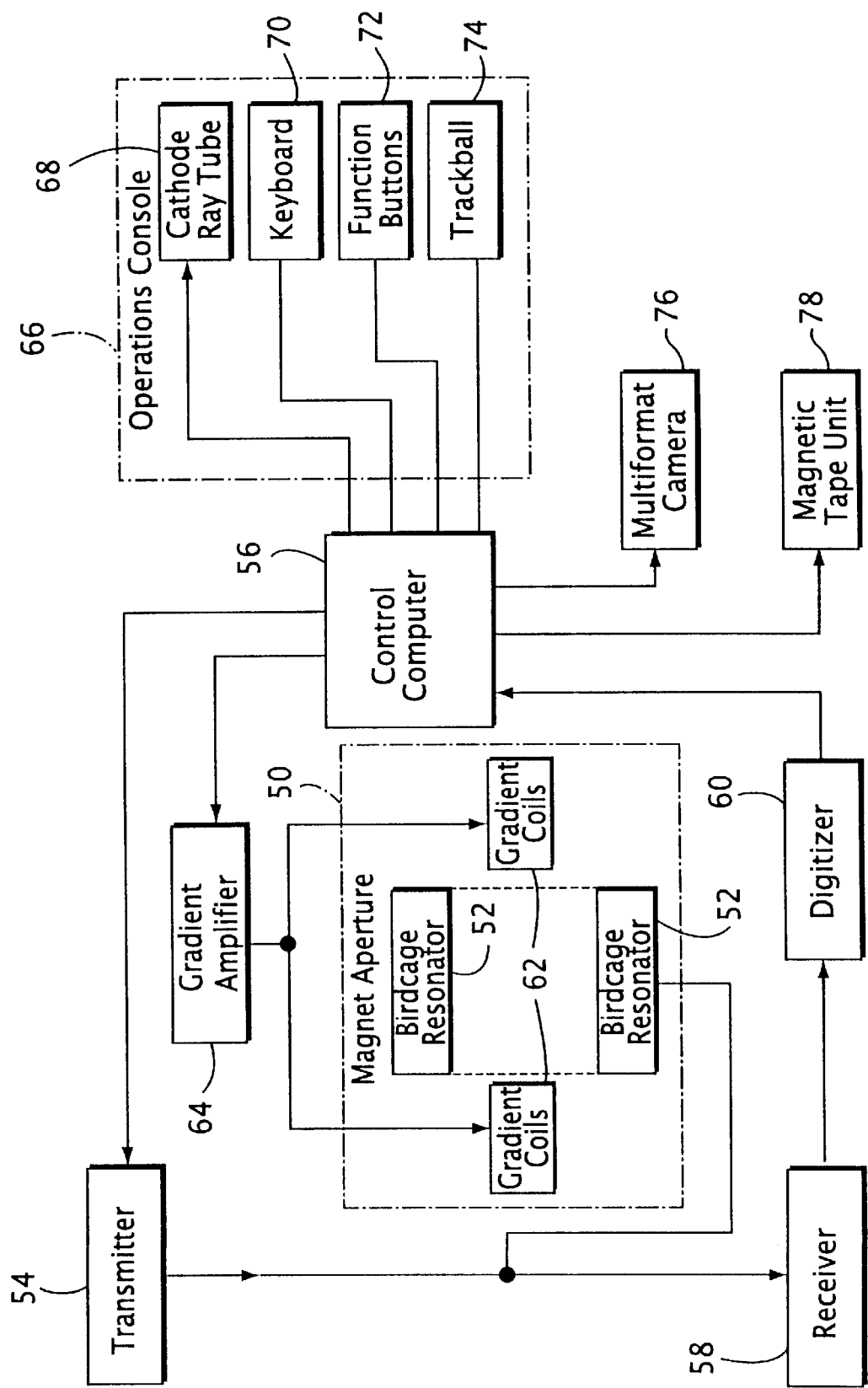
FIG. 4 is a schematic diagram of an MR system.

In FIG. 4, an MR imaging system comprises a magnet having an aperture 50 within which is located a birdcage resonator 52 according to the invention connected to a transmitter 54 supplied from a control computer 56, and to a receiver 58. The receiver is connected through a digitiser 60 to the computer 56.

The magnet aperture 50 also houses conventional gradient coils 62 supplied by a gradient amplifier 64 also controlled by the computer 56. The system has an operating console 66 having typical features such as the cathode ray tube 68, keyboard 70, function buttons 72 and trackball 74, all connected to the computer 56 which also controls a multi-format camera 76 and magnetic tape unit 78.

In operation, the magnet and the gradient coils 62 apply a static magnetic field to a sample/patient located within the magnet aperture 50 and between the coils 62. The transmitter 54 applies a pulse signal at the appropriate radio-frequency to the birdcage resonator 52; the resonator also receives from the sample or patient a signal relating to precession of e.g. protons in the sample/patient, and this signal is transferred through the receiver 58 and digitiser 60 to the computer. By use of the appropriate, conventional controls, an image of the sample/patient in a required format is provided.

By use of a magnetic coil according to the invention and selected to operate in quadrature, dual frequency MR measurements can be made, for example at 34.75 MHz and 85.81 MHz for phosphorus and proton resonances. Alternatively, the coil can be selected to perform field cycled proton-electron double resonance imaging (FC-PEDRI).

If the birdcage resonator according to the invention is intended for low field applications, for example less than 0.1 T, then very large capacitors may be needed to tune the coil at low frequencies, for example 1 MHz to 10 MHz. In such situations, the use of integral capacitors may improve the efficiency of the coil.

What is claimed is:

1. A bird cage resonator coil comprising a pair of parallel conducting end rings, and connected between the end rings a number N of conductors spaced around the end rings at intervals of $2\pi 1/N$, the conductors curving along elliptical paths outside of and beyond the plane of the end rings, the conductors being located between the end rings.

2. A coil according to claim 1 in which the planes in which the elliptical paths of the conductors lie are radial to the end rings.

3. A coil according to claim 2 in which there are four conductors spaced at 90° intervals around the end rings.

4. A coil according to claim 1 in which the conductors are associated in pairs, each pair of conductors curving outwards from the end rings along parallel elliptical paths, the planes in which the elliptical paths lie being parallel to the radius to each end ring intermediate between the connection points of that pair of conductors to the ring.

5. A coil according to claim 4 in which there are eight conductors arranged as four pairs, the pairs being equispaced around the end rings.

6. A coil according to claim 1 in which there is further provided a number N of capacitors in each end ring, connected between adjacent conductors whereby a high-pass birdcage resonator is provided.

7. A magnetic coil according to claim 1 in which there is further provided a number N of capacitors connected one in each conductor of the coil, whereby a low-pass birdcage-type resonator is provided.

8. A coil according to claim 1 in which there are N capacitors in each end ring, connected between adjacent conductors, and there are a further N capacitors connected one in each conductor, whereby a bandstop birdcage-type resonator is provided.

9. A magnetic resonance system comprising a magnet having a horizontal bore and providing a static vertical magnetic field (Bsv), and a birdcage resonator coil according to claim 1 arranged with its end rings in horizontal planes within the horizontal bore.

10. A magnetic resonance system according to claim 9 in which the coil is connected to a transmitter and to a receiver, the transmitter and receiver being connected to a control computer; and further comprising gradient coils (62) supplied by a gradient amplifier; and an operating console.

11. A bird cage resonator coil comprising a pair of parallel circular conducting end rings, and connected between said end rings a number N of conductors spaced around the end rings at intervals of $2\pi 1/N$, said conductors curving along elliptical paths outside of and beyond the plane of the end rings, the conductors being located between the end rings.

12. A bird cage resonator coil comprising a pair of parallel conducting end rings, and connected between said end rings a number of conductors spaced around the end rings, said conductors curving along elliptical paths outside of and beyond the plane of the end rings, the conductors being located between the end rings.

\* \* \* \* \*